US009528411B2

(12) United States Patent
Niaz

(10) Patent No.: US 9,528,411 B2
(45) Date of Patent: Dec. 27, 2016

(54) EMISSIONS CLEANING MODULE

(71) Applicant: Perkins Engines Company Limited, Cambridgeshire (GB)

(72) Inventor: Naseer A. Niaz, Cambridgeshire (GB)

(73) Assignee: Perkins Engines Company Limited, Peterborough (GB)

( * ) Notice: Subject to any disclaimer, the term of this patent is extended or adjusted under 35 U.S.C. 154(b) by 121 days.

(21) Appl. No.: 14/394,227

(22) PCT Filed: Dec. 7, 2012

(86) PCT No.: PCT/GB2012/053067
§ 371 (c)(1),
(2) Date: Oct. 13, 2014

(87) PCT Pub. No.: WO2013/160639
PCT Pub. Date: Oct. 31, 2013

(65) Prior Publication Data
US 2015/0075122 A1 Mar. 19, 2015

(30) Foreign Application Priority Data
Apr. 24, 2012 (GB) .................................. 1207201.3

(51) Int. Cl.
*F01N 3/24* (2006.01)
*F01N 3/20* (2006.01)
(Continued)

(52) U.S. Cl.
CPC ............. *F01N 3/20* (2013.01); *B01D 46/0002* (2013.01); *B01D 46/0057* (2013.01);
(Continued)

(58) Field of Classification Search
CPC ........ F01N 3/24; F01N 3/2066; F01N 3/2892; F01N 2610/1453; F02D 41/027; F02D 41/0077; Y02T 10/24
(Continued)

(56) References Cited

U.S. PATENT DOCUMENTS 7,730,721 B2  6/2010 Kimura et al.
2010/0257850 A1  10/2010 Kowada et al.
(Continued)

FOREIGN PATENT DOCUMENTS

CN  101065561  10/2007
CN  102046939  5/2011
(Continued)

OTHER PUBLICATIONS

European Patent Office, International Search Report in International Patent Application No. PCT/GB2012/053067, Mar. 18, 2013, 4 pp.

*Primary Examiner* — Jacob T Minskey
*Assistant Examiner* — Minh-Chau Pham

(57) ABSTRACT

An emissions cleaning module is provided including a flow conduit having an upstream end fluidly connected to a source of exhaust fluid and a downstream end fluidly connected to a mixer module. The flow conduit includes a bend upstream of the mixer module. An inner side of the bend of the flow conduit includes a funnel portion. The emissions cleaning module provides an improved arrangement for the flow of exhaust fluid.

19 Claims, 7 Drawing Sheets

(51) Int. Cl.
*F01N 3/28* (2006.01)
*F01N 13/08* (2010.01)
*F01N 13/00* (2010.01)
*F01N 13/14* (2010.01)
*F01N 13/18* (2010.01)
*F01N 3/021* (2006.01)
*F01N 3/02* (2006.01)
*F01N 3/023* (2006.01)
*G01M 15/10* (2006.01)
*B60R 13/08* (2006.01)
*B01D 46/00* (2006.01)
*F01N 3/08* (2006.01)
*B01D 53/86* (2006.01)
*F01N 3/035* (2006.01)
*B01D 53/92* (2006.01)
*F01N 9/00* (2006.01)
*H05K 5/02* (2006.01)
*H05K 7/20* (2006.01)
*B01F 5/06* (2006.01)
*F01N 1/08* (2006.01)

(52) U.S. Cl.
CPC ........... *B01D 53/864* (2013.01); *B01D 53/92* (2013.01); *B60R 13/0876* (2013.01); *F01N 3/02* (2013.01); *F01N 3/021* (2013.01); *F01N 3/0233* (2013.01); *F01N 3/035* (2013.01); *F01N 3/08* (2013.01); *F01N 3/28* (2013.01); *F01N 3/2892* (2013.01); *F01N 9/00* (2013.01); *F01N 13/00* (2013.01); *F01N 13/008* (2013.01); *F01N 13/08* (2013.01); *F01N 13/14* (2013.01); *F01N 13/143* (2013.01); *F01N 13/18* (2013.01); *F01N 13/1805* (2013.01); *G01M 15/102* (2013.01); *H05K 5/02* (2013.01); *H05K 7/20436* (2013.01); *B01F 5/0613* (2013.01); *B01F 2005/0621* (2013.01); *B01F 2005/0636* (2013.01); *F01N 1/086* (2013.01); *F01N 2240/20* (2013.01); *F01N 2260/022* (2013.01); *F01N 2260/20* (2013.01); *F01N 2450/22* (2013.01); *F01N 2470/04* (2013.01); *F01N 2490/06* (2013.01); *F01N 2610/1453* (2013.01); *Y10T 29/49345* (2015.01)

(58) Field of Classification Search
USPC .............. 55/385.1, 385.3; 60/274, 295, 301; 73/114.71
See application file for complete search history.

(56) References Cited

U.S. PATENT DOCUMENTS

| | | | |
|---|---|---|---|
| 2011/0079003 A1 | 4/2011 | Sun et al. | |
| 2013/0219871 A1* | 8/2013 | Crandell | F01N 3/2066 60/295 |
| 2014/0237998 A1* | 8/2014 | Fahrenkrug | F01N 3/2066 60/301 |
| 2015/0059319 A1* | 3/2015 | Shiva | F01N 3/2066 60/295 |
| 2015/0059457 A1* | 3/2015 | Niaz | F01N 3/2892 73/114.71 |
| 2015/0135680 A1* | 5/2015 | Ancimer | F02D 41/027 60/274 |
| 2015/0204227 A1* | 7/2015 | Eager | F02D 41/0077 60/274 |

FOREIGN PATENT DOCUMENTS

| | | |
|---|---|---|
| CN | 102071994 | 5/2011 |
| EP | 1770253 | 4/2007 |
| EP | 2295756 A1 | 3/2011 |
| EP | 2325452 A1 | 5/2011 |
| EP | 2957740 | 12/2015 |
| JP | 2011157825 | 8/2011 |
| WO | WO 2011/133155 A1 | 10/2011 |

\* cited by examiner

EMISSIONS CLEANING MODULE

TECHNICAL FIELD

The disclosure relates to an apparatus for cleaning fluids emitted during the operation of combustion engines.

BACKGROUND

Engines, for example IC engines burning gasoline, diesel or biofuel, output various harmful substances which must be treated to meet current and future emissions legislation. Most commonly those substances comprise hydrocarbons (HC), carbon monoxides (CO), mono-nitrogen oxides ($NO_x$) and particulate matter, such as carbon (C), a constituent of soot. Some of those substances may be reduced by careful control of the operating conditions of the engine, but usually it is necessary to provide an emissions cleaning module downstream of the engine to treat at least some of those substances entrained in the exhaust gas. Various apparatus for reducing and/or eliminating constituents in emissions are known. For example, it is known to provide an oxidation device, such as a diesel oxidation catalyst, to reduce or to eliminate hydrocarbons (HC) and/or carbon monoxide (CO). Oxidation devices generally include a catalyst to convert those substances into carbon dioxide and water, which are significantly less harmful. As a further example, emissions cleaning modules may include a particulate filter to restrict the particulates present in the exhaust gas from being output to atmosphere.

By use of an emissions cleaning module, engine emissions can be cleaned, meaning that a proportion of the harmful substances which would otherwise be released to atmosphere are instead converted to carbon dioxide ($CO_2$), nitrogen ($N_2$) and water ($H_2O$).

In addition, it is known to reduce or eliminate mono-nitrogen oxides ($NO_x$) in diesel combustion emissions by conversion to diatomic nitrogen ($N_2$) and water ($H_2O$) by catalytic reaction with chemicals such as ammonia ($NH_3$) entrained in the exhaust gas. Generally ammonia is not present in exhaust gas and must therefore be introduced upstream of a catalyst, typically by injecting a urea solution into the exhaust gas which decomposes into ammonia at sufficiently high temperatures.

By these methods, engine emissions can be cleaned, meaning that a proportion of the harmful substances which would otherwise be released to atmosphere are instead converted to carbon dioxide ($CO_2$), nitrogen ($N_2$) and water ($H_2O$).

Emissions cleaning modules may also comprise an injector module for injecting a fluid, such as urea, into the engine emissions flow. It is also know to include a mixer module to aid mixer of the injected urea with the engine emissions flow. For example, US2010/0257850 describes an emission cleaning module having a mixer pipe into which urea is injected. It is desirable to fully mix the injected urea into the engine emissions flow. Otherwise deposits of urea can build-up within the emissions cleaning module. These deposits can degrade performance of the emissions cleaning module and may potentially interfere with, or block, further injection fluid from proper mixing.

Against this background there is provided an emissions cleaning module comprising an improved arrangement for injecting an injection fluid into a flow of exhaust fluid.

SUMMARY OF THE DISCLOSURE

The present disclosure provides an emissions cleaning module comprising:

a flow conduit having an upstream end fluidly connected to a source of exhaust fluid and a downstream end fluidly connected to a mixer module;

the flow conduit comprises a bend upstream of the mixer module;

wherein an inner side of the bend of the flow conduit comprises a funnel portion.

BRIEF DESCRIPTION OF THE DRAWINGS

The present disclosure will now be described, by way of example only, with reference to the accompanying drawings in which.

DETAILED DESCRIPTION

Figure 1:
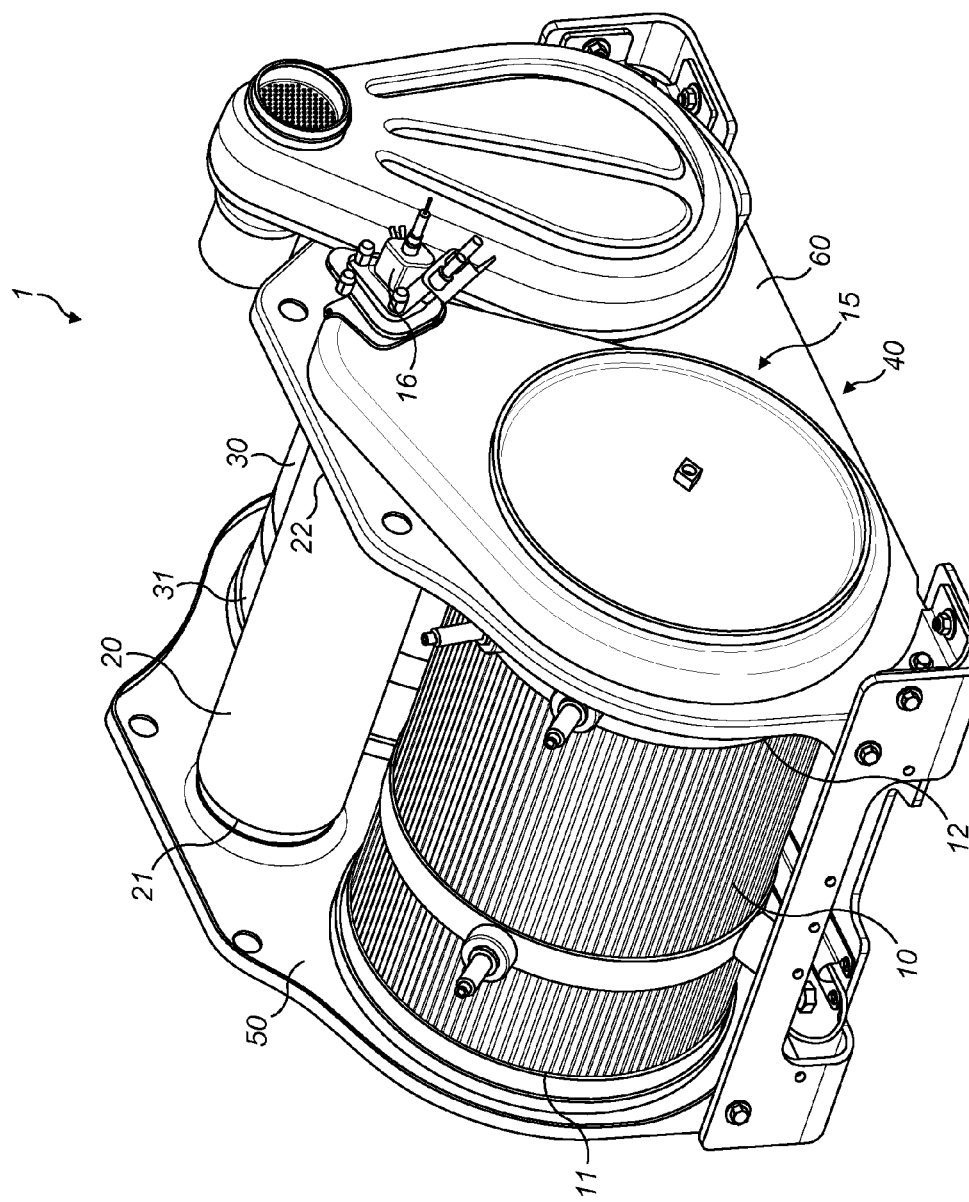
FIG. 1 shows an emissions cleaning module in accordance with the present disclosure.

An emissions cleaning module 1 is illustrated in FIG. 1.

The emissions cleaning module 1 may comprise a first conduit 10 and a second conduit 20. A third conduit 30 and a support structure 40 may also be present. The support structure 40 comprises a first support member 50 and a second support member 60.

Each support member 50, 60 may be generally planar and may be of rigid material, for example metal.

The first, second and third conduits 10, 20, 30 may be elongate, having an axis of elongation, and may have substantially constant cross-section along the axis of elongation. The first, second and third conduits 10, 20, 30 may be substantially cylindrical.

The first conduit 10 comprises a first end 11 providing an inlet to the conduit and a second end 12 providing an outlet to the conduit. The second conduit 20 comprises a first end 21 providing an outlet to the conduit and a second end 22 providing an inlet to the conduit. The third conduit 30 may comprise a first end 31 providing an inlet to the conduit and a second end providing an outlet to the conduit.

The conduits 10, 20, 30 may extend between the support members 50, 60. The conduits 10, 20, 30 may be generally substantially parallel. The first ends 11, 21, 31 of the first, second and third conduits 10, 20, 30 may be received in and may be shaped to correspond with first, second and third openings 51, 52, 53, respectively, of the first support member 50. The second ends 12, 22 of the first, second and third conduits 10, 20, 30 may be received in and may be shaped to correspond with first, second and third openings 61, 62, 63, respectively, of the second support member 60. By this arrangement, lateral movement of the conduits may be restricted.

Figure 2:
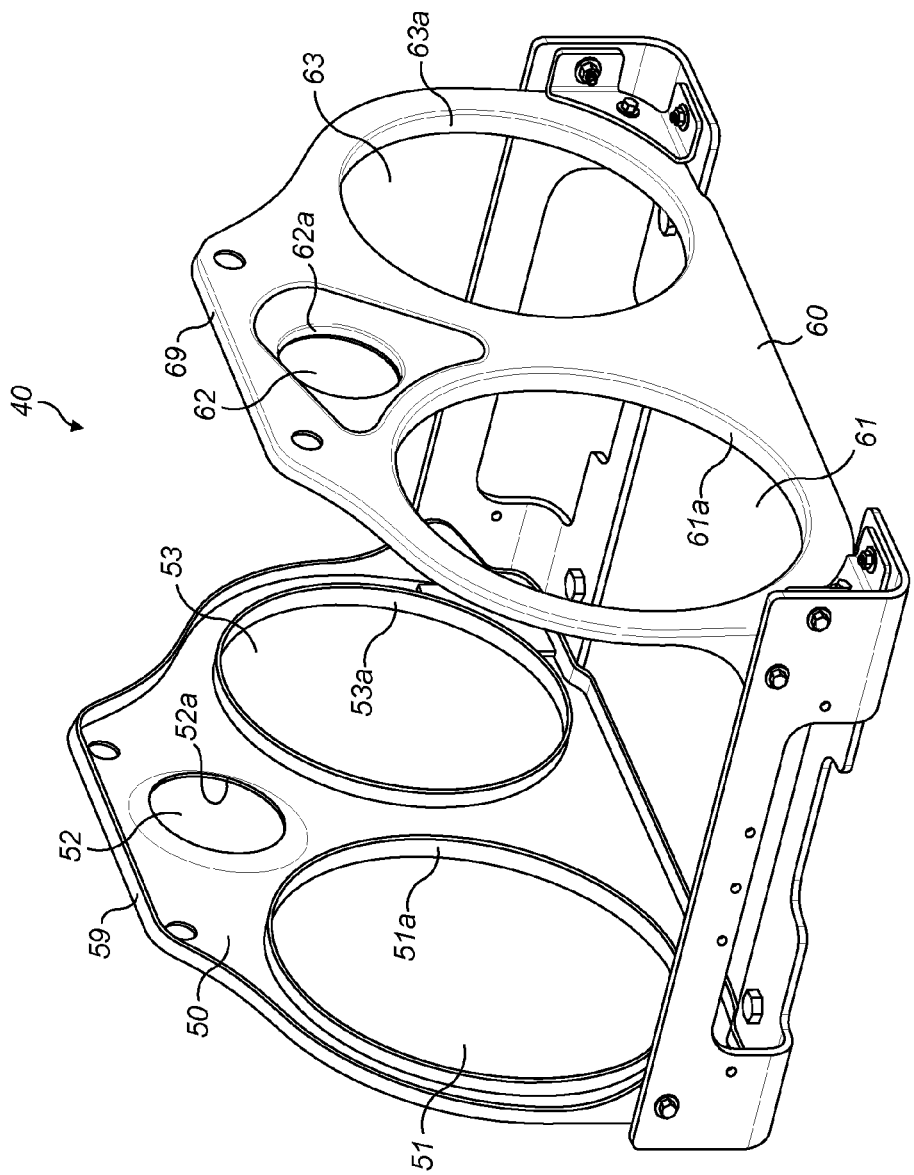
FIG. 2 shows a support frame of the emissions cleaning module of FIG. 1.
Figure 3:
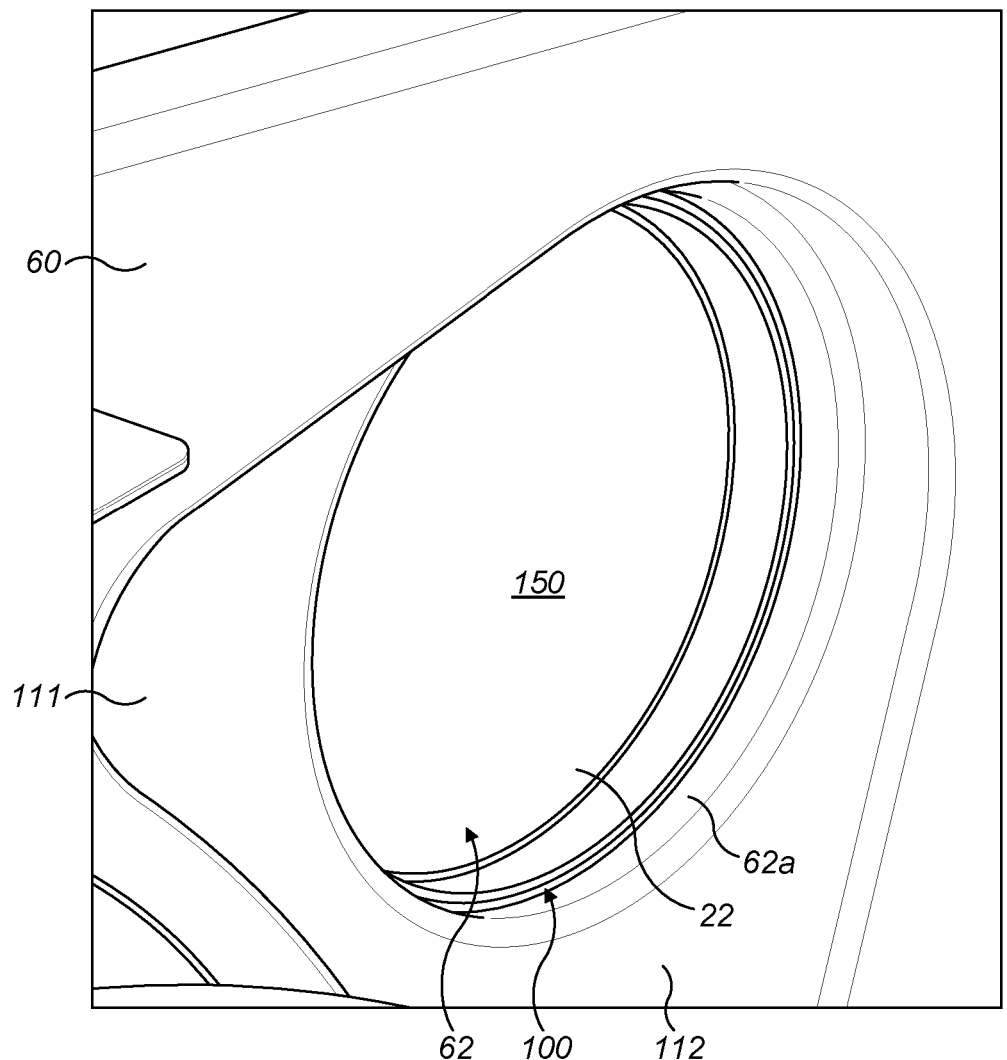
FIG. 3 shows a perspective view of a part of the emissions cleaning module of FIG. 1

As shown in FIG. 2, each opening 51, 52, 53, 61, 62, 63 may comprise a flange 51a, 52a, 53a, 61a, 62a, 63a extending around a perimeter of the opening. Each support member 50, 60 may further comprise an inwardly turned lip 59, 69 extending at least part way around a periphery of the support member 50, 60.

The conduits 10, 20, 30 may all be of substantially similar length. The first conduit 10 may have a first diameter, the second conduit 20 may have a second diameter and the third conduit 30 may have a third diameter. The second diameter may be smaller than the first and third diameters.

The first and second ends 11, 21, 31, 12, 22 of the conduits 10, 20, 30 may be welded, adhered or otherwise secured to portions of the support members 50, 60 defining or surrounding the openings. Alternatively, first and second ends 11, 21, 31, 12, 22 of the conduits 10, 20, 30 may abut the inner sides of the support members 50, 60 so as to overlie respective openings in the support members 50, 60.

The first, second and third conduits 10, 20, 30 and the first and second support members 50, 60 may be interconnected in a manner which restricts relative translational movement of those components. Instead or in addition, the first, second and third conduits 10, 20, 30 and the first and second support members 50, 60 may be interconnected in a manner which restricts rotational movement of one component with respect to another.

The first conduit 10 is fluidly coupled to the second conduit 20 via a first end coupling 15 which fluidly connects the outlet of the first conduit 10 to the inlet of the second conduit 20. The first end coupling 15 may comprise an injector module 16. The second conduit 20 may be coupled to the third conduit 30 via a second end coupling for fluidly connecting the outlet of the second conduit 20 to the inlet of the third conduit 30. Each of the first and second end couplings may define, in combination with its respective support member, a fluid flow path through which exhaust gas may pass between adjacent conduits.

Within the fluid flow path of the emissions cleaning module there may be located a diesel oxidation catalyst (DOC) module, a diesel particulate filter (DPF) module, the injector module 16, a mixer module 75, a selective catalyst reduction (SCR) module and an ammonia oxidation catalyst (AMOX) module.

The DOC module may be located in a first portion of the first conduit 10 towards the first, inlet, end 11 of the first conduit 10. The DPF module may be located in a second portion of the first conduit 10 towards the second, outlet, end 12 of the first conduit 10. The first end coupling 15 may provide a fluid flow path from the second end 12 of the first conduit 10 to the second end 22 of the second conduit 20. The first end coupling 15 may comprise the injector module 16.

The mixer module 75 may be located in, or formed by, the second conduit 20. The mixer module 75 may comprise an outer body 80 and an inner body 81 located within the outer body 80. The outer body 80 may form the external skin of the second conduit 20. An air gap 88 may be provided between the inner body 81 and the outer body 80.

Figure 4:
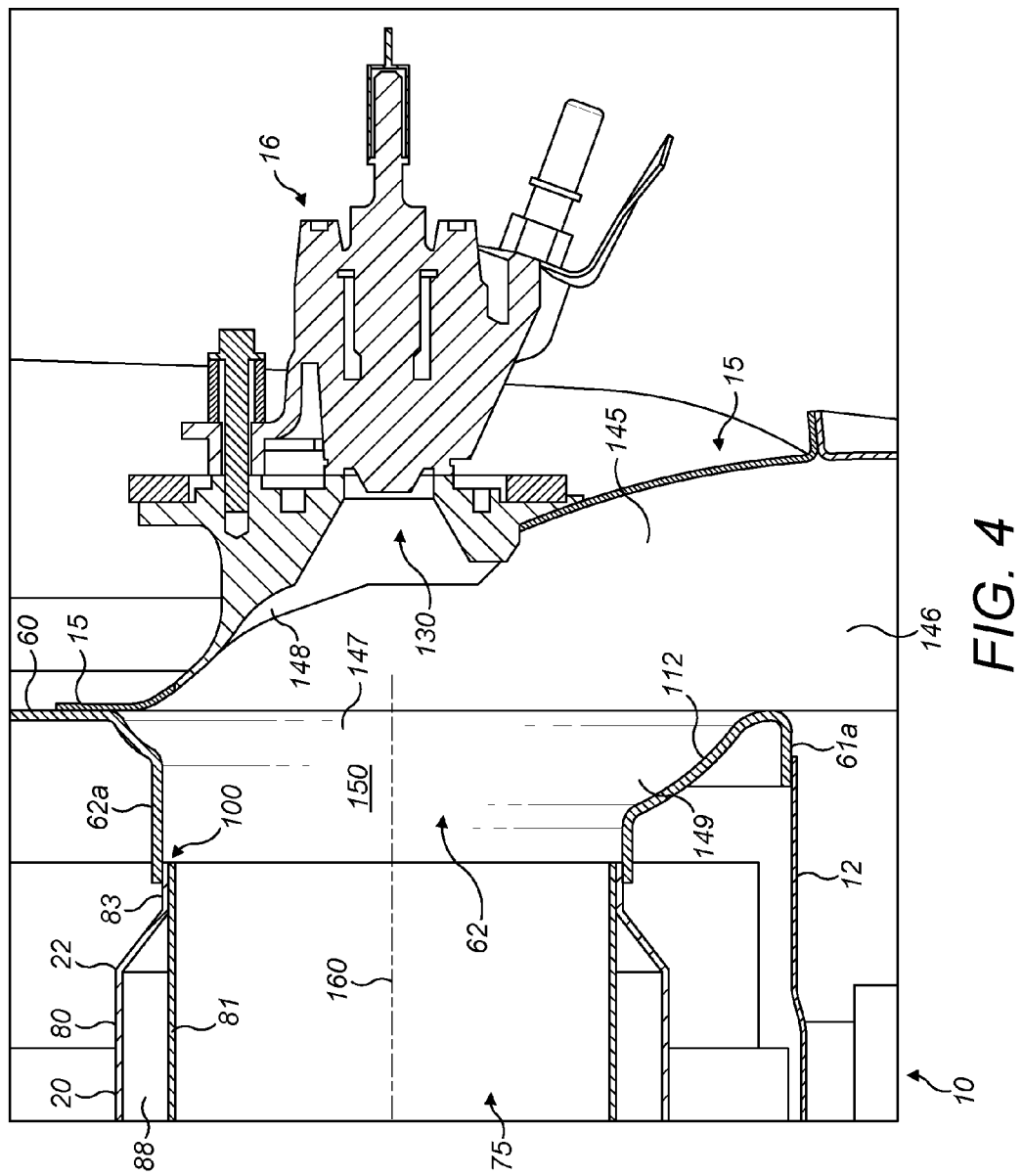
FIG. 4 shows a cross-section through a part of the emissions cleaning module of FIG. 1.
Figure 5:
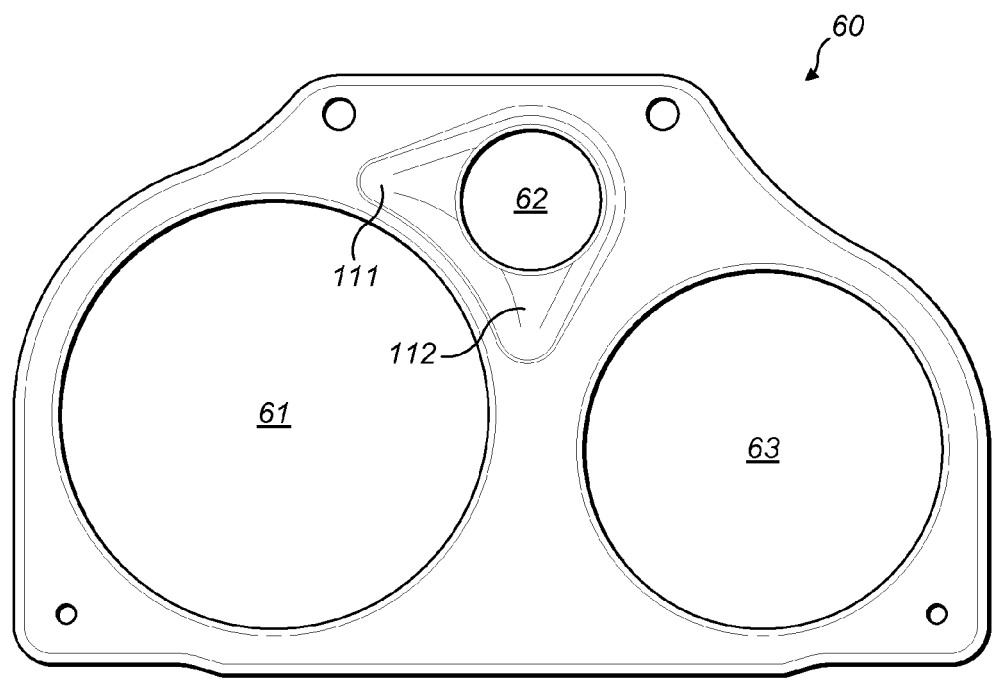
FIG. 5 shows a second support plate of the emissions cleaning module of FIG. 1, from a first side.

The outer body 80 may be elongate and extends between the first support 50 and the second support 60. The outer body 80 may be cylindrical and may have a constant diameter except at the ends thereof which may have a smaller diameter. A first end of the outer body 80 may be fixedly retained to the first support 50. The fixation may be by means of a weld between the first end and the flange 52a. The connection may be to an inner or outer face of the flange 52a. A second end 83 of the outer body 80 may be fixedly retained to the second support 60. The fixation may be by means of a weld between the second end 83 and the flange 62a. The connection may be to an inner face of the flange 62a, as shown in FIG. 4. This attachment may create a small annular crevice 100 where an end rim of the second end 83 lies adjacent the flange 62a.

The mixer module 75 may be configured to mix a fluid injected by the injector module 16 with a fluid arriving from the first conduit 10. The mixer module 75 may comprise multiple features, such as interspersed fins, which may give rise to an even blend of the injected fluid with the fluid from the first conduit 10.

The injector module 16 may comprise an injector having an injection outlet 130. The injection outlet 130 may be orientated to direct injected fluid along a longitudinal axis of the mixer module 75. The injector module 16 may be associated with or attachable to a pump electronic tank unit (PETU). The pump electronic, tank unit may comprise a tank for providing a reservoir for fluid to be injected by the injector. Such fluids may include urea or ammonia. The PETU may further comprise a controller configured to control a volume of fluid to be injected from the tank by the injector. The controller may have as inputs, for example, temperature information and quantity of $NO_x$ information which may be derived from sensors in the SCR module.

The first end coupling 15 may be in the form of a flow hood. The first end coupling 15, together with the first conduit 10, the second support 60 and the mixer module 75 may define a flow conduit for exhaust fluid. The flow conduit may comprise a bend, for example a U-bend, that reverses the direction of flow of the exhaust fluid from when it leaves the first conduit 10 to when it enters the mixer module 75. The first end coupling 15 may comprise a central section 145 in which the direction of fluid flow is substantially perpendicular to the direction of fluid flow in the first conduit 10. The first end coupling 15 may further comprise a first 90° bend 146 adjacent the first conduit 10 and a second 90° bend 147 adjacent the mixer module 75.

The injector module 16 may be mounted into an aperture in the first end coupling 15. The injector module 16 may be mounted on an outside 148 of the second 90° bend 147.

The opening 62 may define a bore 150 which fluidly connects the second 90° bend 147 of the first end coupling 15 to the mixer module 75.

Figure 6:
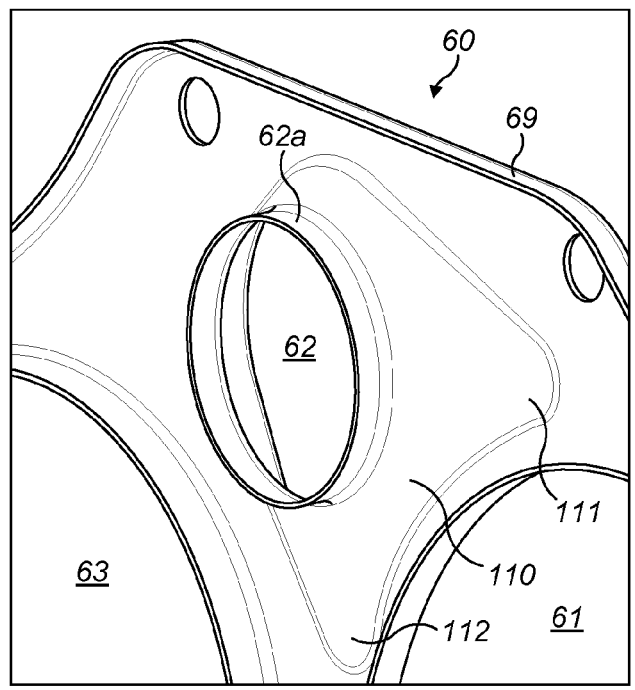
FIG. 6 shows the second support plate of FIG. 5, from a second side.

The first end coupling 15 may be connected to a first side of the second support 60 and the mixer module 75 may be connected to a second side of the second support 60. The flange 62a surrounding the second opening 62, as shown in FIG. 6, may be joined to a remainder of the second support 60 by a curved section 110. The curved section 110 may comprise two recesses 111, 112, which may be arranged around the axis of the bore 150. The recesses 111, 112 may be on an inside 149 of the second 90° bend 147. The recesses 111, 112 may each form a localised enlargement of the bore 150.

Instead of two recesses 111, 112 only one recess may be provided.

The recesses 111, 112 each form a funnel portion on an inner side of the bend of the flow conduit. Each recess 111, 112 may comprise a shaped portion of the second support 60 which has an increased radius of curvature compared to the radius of curvature of a centreline 160 of the bend. Each recess 111, 112 may comprise a concave recess. The recesses 111, 112 serve to make the bend in the flow conduit more gentle. In particular, they serve to decrease the sharpness of the second 90° bend 147 at the inner side of the bend.

Figure 7:
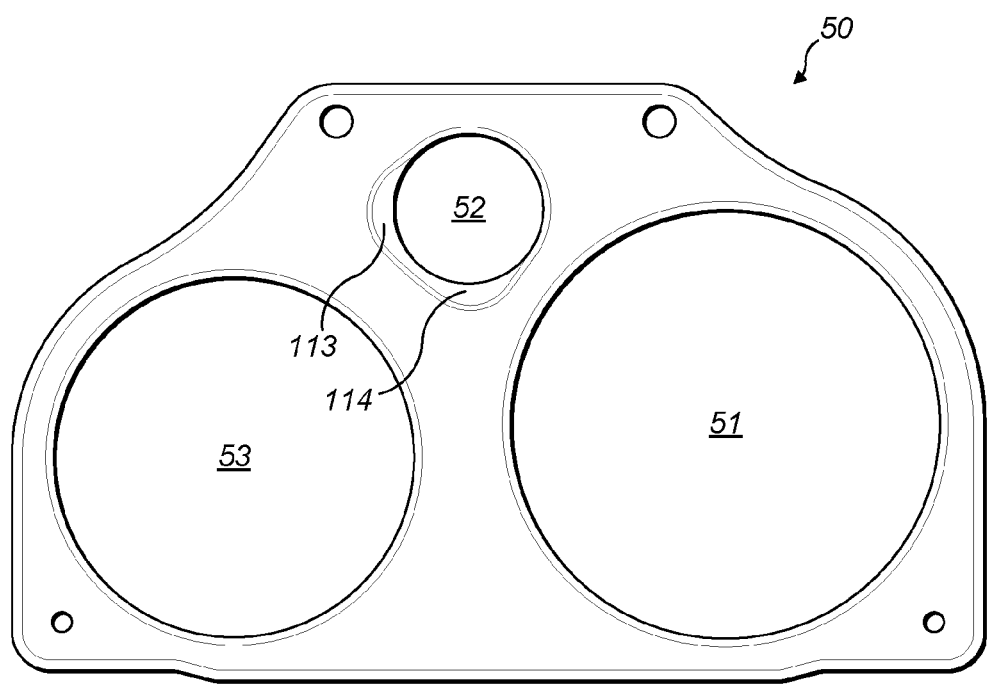
FIG. 7 shows another embodiment of first support plate, from a first side.
Figure 8:
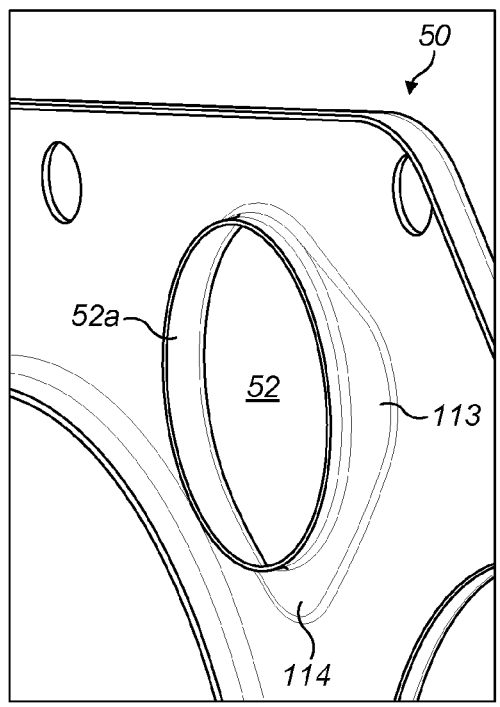
FIG. 8 shows the first support plate of FIG. 7, from a second side.

The second end coupling may provide a fluid flow path from the first end 21 of the second conduit to the first end 31 of the third conduit 30. As shown in FIGS. 7 and 8, the first support 50 may also be provided with recesses 113, 114 adjacent the second opening 52. The recesses 113, 114 may be arranged around the axis of a bore of the second opening 52. The recesses 113, 114 may be on an inside of a bend in the flow conduit which direct the flow of exhaust fluid from the first end 21 of the second conduit 20 to the first end 31 of the third conduit. The recesses 113, 114 may each form a localised enlargement of the bore.

Instead of two recesses 113, 114 only one recess may be provided.

The recesses 113, 114 each form a funnel portion on an inner side of the bend of the flow conduit. Each recess 113, 114 may comprise a shaped portion of the first support 50 which has an increased radius of curvature compared to the radius of curvature of a centreline of the bend. Each recess 113, 114 may comprise a concave recess. The recesses 113, 114 serve to make the bend in the flow conduit more gentle.

The SCR module may be located in a first portion of the third conduit 30 towards the first end 31 of the third conduit 30. The SCR module may comprise a catalyst surface intended to catalyse a reaction to occur between the two fluids mixed in the mixer module and output by the diffuser. The AMOX module may both be located in a second portion of the third conduit 30 towards the second end of the third conduit 30. The AMOX module may comprise a catalyst which may catalyse a reaction of one or more of the products output from the SCR module.

In use, exhaust fluid may be supplied to the emissions cleaning module 1 via an inlet. Fluid may pass into the DOC module in the first portion of the first conduit 10. Prior to receipt at the inlet, the pressure of the fluid may be controlled by a back pressure valve.

The DOC module may comprise one or more catalysts, such as palladium or platinum. These materials serve as catalysts to cause oxidation of hydrocarbons ([HC]) and carbon monoxide (CO) present in the fluid flow in order to produce carbon dioxide ($CO_2$) and water ($H_2O$). The catalysts may be distributed in a manner so as to maximise the surface area of catalyst material in order to increase effectiveness of the catalyst in catalysing reactions.

Fluid may flow from the DOC module to the DPF module which comprises features which are intended to prevent onward passage of carbon (C) in the form of soot. Carbon particles in the fluid may thus trapped in the filter. The filter may be regenerated through known regeneration techniques. These techniques may involve controlling one or more of the temperature of the fluid, the pressure of the fluid and the proportion of unburnt fuel in the fluid.

Fluid may pass from the DOC into the first end coupling 15. The fluid flow may pass around the first 90° bend 146 into the central section 145, then into the second 90° bend 147. The flow passes the injection outlet 130 of the injector module 16. The injector module 16 may inject the injection fluid, for example urea or ammonia, into the flow. The direction of the injection of the injection fluid may be into the bore 150 of the second opening 62. The direction of injection may be along the axis of the mixer module 75.

Figure 9:
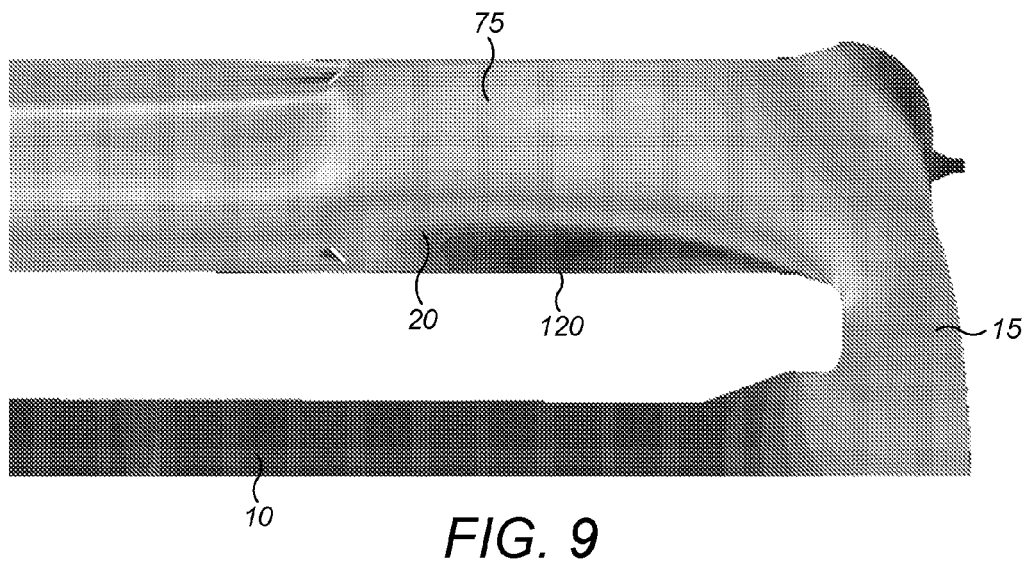
FIGS. 9 and 10 show comparative fluid pressures within a part of the emissions cleaning module of FIG. 1, with and without the provision of a funnel portion.
Figure 10:
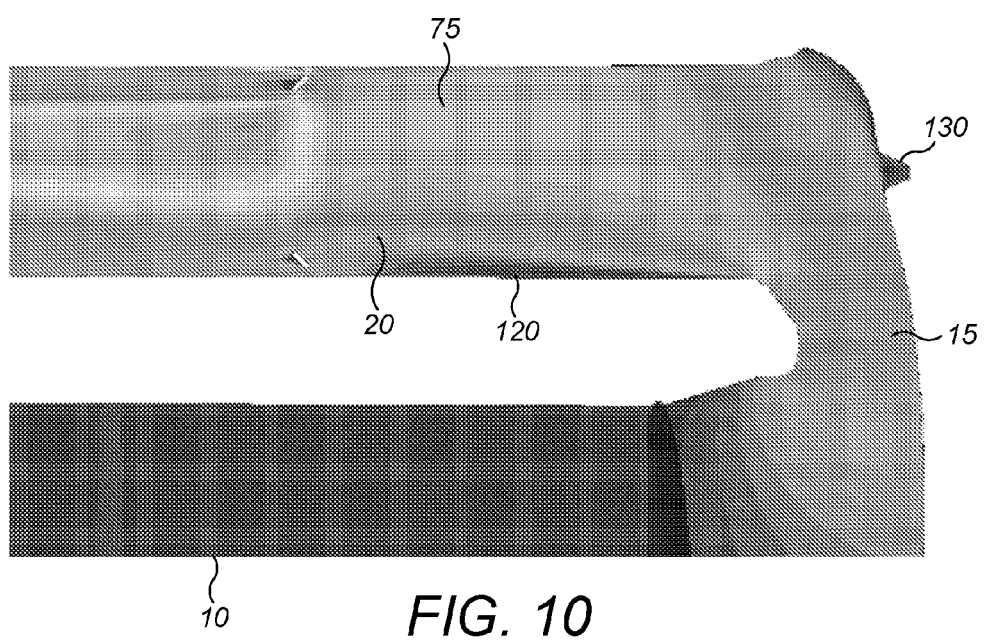

The flow of the exhaust fluid around the bend may be modified by the presence of the recesses 111, 112. FIG. 10 illustrates the pressure distribution within the flow with the recesses 111, 112 present. FIG. 9 illustrates the pressure distribution within the flow without such recesses. The presence of the recesses 111, 112 may have the beneficial effect of reducing or eliminating flow separation from the wall 120 of the mixer module 75 adjacent the inside of the bend. This is believed to be because the reduced sharpness of the bend, in particular the second 90° bend 147, may reduce a low pressure zone adjacent wall 120 which may otherwise develop.

As a consequence a more uniform flow of exhaust fluid (now containing the injection fluid) may be produced within the mixer module 75. This may help to reduce the build-up of deposits derived from the injection fluid.

The mixer module 75 may further comprise features for ensuring that the fluid originating from the first conduit 10 undergoes further mixing with the fluid originating from the injector 16 within the second conduit 20 itself.

After the mixer module 75, fluid may then pass via the second end coupling into the SCR module located in the first portion of the third conduit via the second end coupling. The SCR module may comprise one or more catalysts through which the mixture of exhaust gas and urea/ammonia may flow. As the mixture passes over the surfaces of the catalyst a may reaction occur which converts the ammonia and $NO_x$ to diatomic nitrogen ($N_2$) and water ($H_2O$).

Fluid may pass from the SCR module to the AMOX module located in the second portion of the third conduit 30. The AMOX module may comprise an oxidation catalyst which may cause residual ammonia present in the fluid exiting the SCR module to react to produce nitrogen ($N_2$) and water ($H_2O$).

Fluid may pass from the AMOX module to the emissions cleaning module outlet located at the second end of the third conduit 30.

INDUSTRIAL APPLICABILITY

The present disclosure provides an emissions cleaning module comprising an improved arrangement for the flow of exhaust fluid.

The invention claimed is:

1. An emissions cleaning module comprising:
    a flow conduit having an upstream end fluidly connected to a source of exhaust fluid and a downstream end fluidly connected to a mixer module;
    the flow conduit comprises a bend upstream of the mixer module;
    wherein an inner side of the bend of the flow conduit comprises a funnel portion including a concave recess.

2. An emissions cleaning module as claimed in claim 1 wherein the bend extends through at least 90°.

3. An emissions cleaning module as claimed in claim 1 or wherein the funnel portion comprises a shaped portion of the flow conduit which increases the radius of curvature of at least a portion of the inner side of the flow conduit compared to the radius of curvature of a centreline of the bend.

4. An emissions cleaning module as claimed in claim 1 wherein the inner side of the bend of the flow conduit comprises two funnel portions.

5. An emissions cleaning module as claimed in claim 1 wherein the upstream end of the flow conduit is connected to a first conduit;
    wherein, in use, a direction of flow of exhaust fluid within the first conduit is opposite a direction of flow of exhaust fluid within the mixer module;
    wherein the bend comprises a U-bend.

6. An emissions cleaning module as claimed in claim 5 wherein the funnel portion is located in a second half of the U-bend.

7. An emissions cleaning module as claimed in claim 1 further comprising a flow hood.

8. An emissions cleaning module as claimed in claim 7 further comprising a support which supports the flow hood and the mixer module.

9. An emissions cleaning module as claimed in claim 8 wherein the support fluidly connects the flow hood to the mixer module.

10. An emissions cleaning module as claimed in claim 8 wherein the bend is defined by the inter-engagement of the flow hood and the support.

11. An emissions cleaning module as claimed in claim 10 wherein the support comprises a bore through which may pass, in use, the flow of exhaust fluid, and the funnel portion is at least partly formed by a localised enlargement of the bore.

12. An emissions cleaning module as claimed in claim 11 wherein the funnel portion is formed by a recess in the support.

13. An emissions cleaning module as claimed in claim 11 wherein the support includes a concave portion defined on a face forming a part of the flow conduit and the bore is provided in the concave portion; the funnel being defined by a remaining portion of the concave portion.

14. An emissions cleaning module as claimed in claim 7 further comprising an injector module mounted to the flow hood.

15. An emissions cleaning module as claimed in claim 2 wherein the funnel portion comprises a shaped portion of the flow conduit which increases the radius of curvature of at least a portion of the inner side of the flow conduit compared to the radius of curvature of a centreline of the bend.

16. An emissions cleaning module as claimed in claim 3 wherein the upstream end of the flow conduit is connected to a first conduit;
wherein, in use, a direction of flow of exhaust fluid within the first conduit is opposite a direction of flow of exhaust fluid within the mixer module;
wherein the bend comprises a U-bend.

17. An emissions cleaning module as claimed in claim 9 wherein the bend is defined by the inter-engagement of the flow hood and the support.

18. An emissions cleaning module as claimed in claim 4 further comprising a flow hood.

19. An emissions cleaning module as claimed in claim 8 further comprising an injector module mounted to the flow hood.

* * * * *

UNITED STATES PATENT AND TRADEMARK OFFICE
CERTIFICATE OF CORRECTION

PATENT NO. : 9,528,411 B2  
APPLICATION NO. : 14/394227  
DATED : December 27, 2016  
INVENTOR(S) : Naseer A. Niaz It is certified that error appears in the above-identified patent and that said Letters Patent is hereby corrected as shown below:

In the Specification

Column 1, Line 2, below 'Title' insert:
-- CROSS-REFERENCE TO RELATED APPLICATIONS
This application is a U.S. national phase entry under 35 U.S.C. §371 from PCT International Application No. PCT/GB2012/053067, filed Dec. 07, 2012, which claims benefit of priority of UK Patent Application No. 1207201.3 filed Apr. 24, 2012, the subject matter of both of which is incorporated herein by reference. --.

In the Claims

Column 6, Line 48, In Claim 3, delete "claim 1 or" and insert -- claim 1 --.

Signed and Sealed this
Sixteenth Day of May, 2017

Michelle K. Lee
*Director of the United States Patent and Trademark Office*